United States Patent [19]

Schaefer et al.

[11] Patent Number: 5,340,454

[45] Date of Patent: Aug. 23, 1994

[54] METHOD AND APPARATUS FOR THE COATING OF SUBSTRATES

[75] Inventors: Christian Schaefer, Hanau am Main; Klaus Hartig, Ronneburg, both of Fed. Rep. of Germany

[73] Assignee: Leybold Aktiengesellschaft, Hanau, Fed. Rep. of Germany

[21] Appl. No.: 98,751

[22] Filed: Jul. 28, 1993

Related U.S. Application Data

[63] Continuation of Ser. No. 726,932, Nov. 7, 1991, abandoned.

[30] Foreign Application Priority Data

Apr. 9, 1991 [DE] Fed. Rep. of Germany ....... 4111384

[51] Int. Cl.$^5$ .............................................. C23C 14/34
[52] U.S. Cl. .......................... 204/192.12; 204/298.25; 204/298.26; 204/298.27
[58] Field of Search ........... 204/192.1, 192.12, 298.23, 204/298.24, 298.25, 298.26, 298.27

[56] References Cited

U.S. PATENT DOCUMENTS

| | | | |
|---|---|---|---|
| 3,584,847 | 6/1971 | Hammond et al. | 204/298.25 X |
| 3,793,167 | 2/1974 | Glaser | 204/298.25 X |
| 3,945,903 | 3/1976 | Svendor et al. | 204/298.25 X |
| 4,261,808 | 4/1981 | Walter | 204/298.25 |
| 4,274,936 | 6/1981 | Love | 204/298.25 X |
| 4,562,093 | 12/1985 | Mario et al. | 204/298.25 X |
| 4,587,002 | 5/1986 | Bok | 204/298.25 |
| 4,851,095 | 7/1989 | Sixbey et al. | 204/298.26 X |

OTHER PUBLICATIONS

"Decoupling of processes in coating systems by pumped buffers" in Vacuum, vol. 38, No. 8–10, pp. 677–681, 1988.

Primary Examiner—Nam Nguyen
Attorney, Agent, or Firm—Felfe & Lynch

[57] ABSTRACT

Method and apparatus for the coating of substrates (1, 1', ... ), preferably by cathode sputtering in a vacuum apparatus consisting of at least one sputtering chamber (6) in which different coating systems can be applied to the preferably curved substrates to be coated (1, 1', ... ), the substrates (1, 1', ... ) can be moved in a direction B through the vacuum apparatus and pass through the sputtering chamber (6) repeatedly in direction B as well as in the opposite direction in the so-called multipass mode, the uncoated substrates (1, 1', ... ) or substrate carriers (12, 11', ... ) being combined before entering the sputtering chamber into groups of several, preferably two substrates (1, 1', ... ) each, and these run simultaneously through the sputtering chamber (6) in the so-called dual multipass mode.

1 Claim, 2 Drawing Sheets

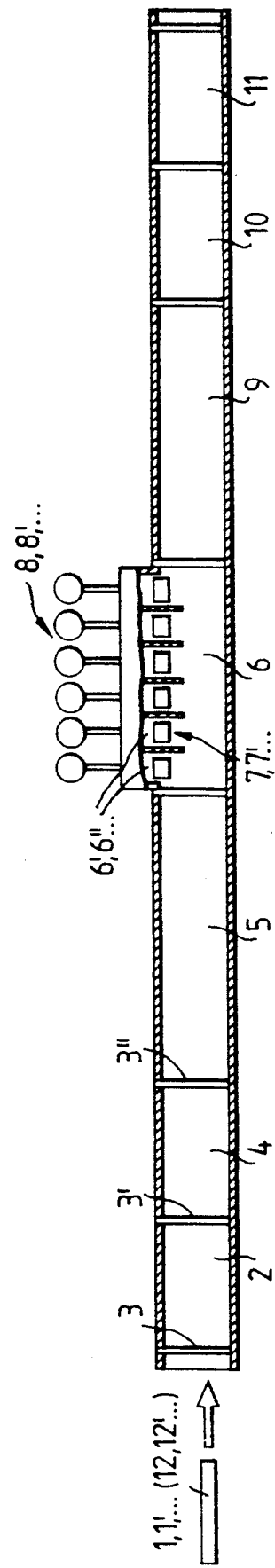

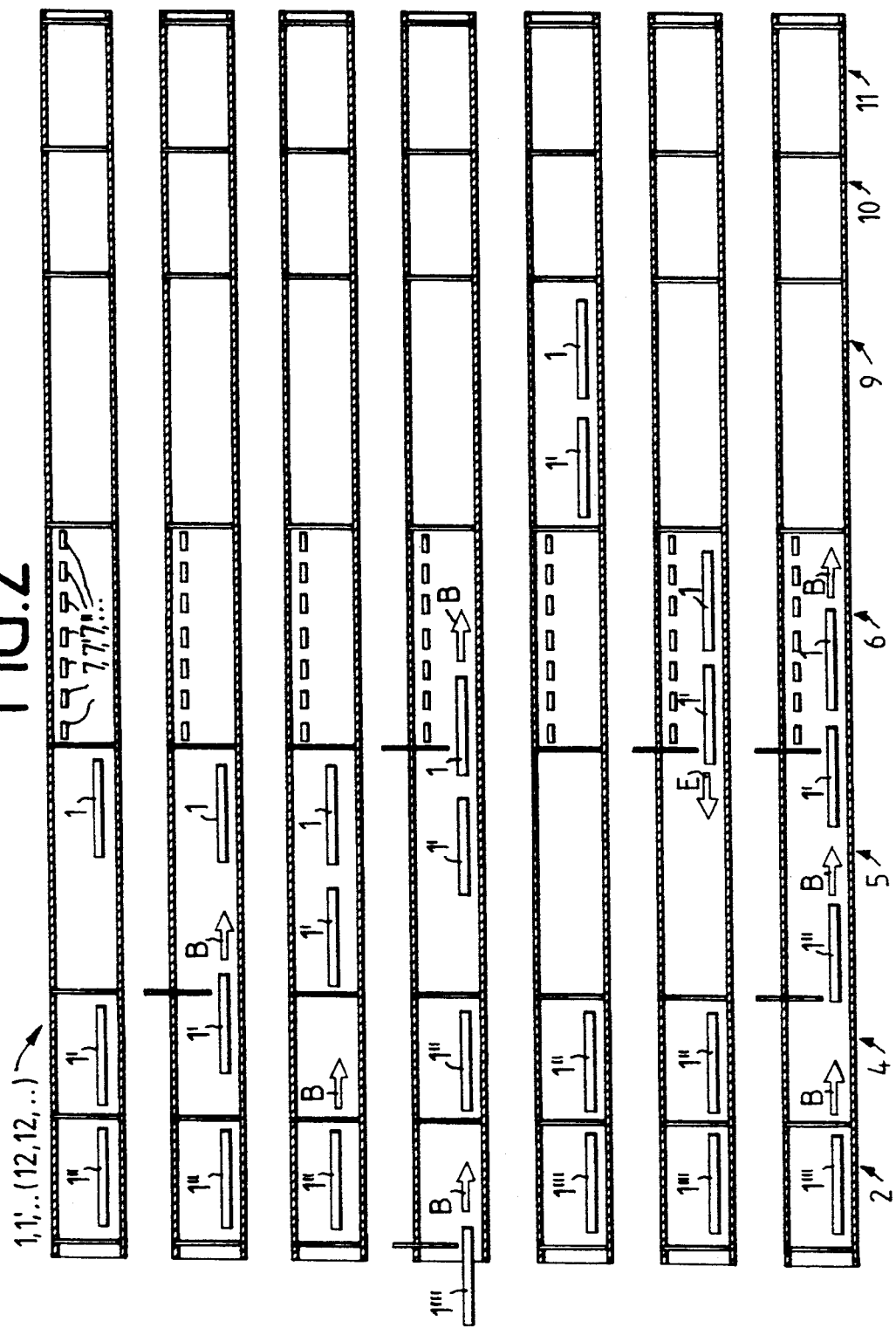

METHOD AND APPARATUS FOR THE COATING OF SUBSTRATES

This application is a continuation of application Ser. No. 726,932, filed Nov. 7, 1991 abandoned.

The invention relates to a method and an apparatus for the coating of substrates in accordance with the introductory part of claim 1.

In the state of the art, coating processes are known, for example in the field of large-area glass coating for planar, plate-like substrates which take place mostly in pass-through or so-called "in-line" apparatus. For coating substrates with different materials, or also for the application of various coating systems, the coating apparatus must be designed to be as flexible as possible and therefore usually must have several sputtering cathodes.

To be able to separate reliably from one another sputtering cathodes which are operated in different gas atmospheres and prevent undesired gas overflows, so-called "dynamic slit gates" with intermediate pumping stations are used (see also Weisweiler, Buschbeck and Schwarz, "Decoupling of processes in coating systems by pumped buffers" in Vacuum, Vol. 38, No. 8–10, pages 677–681, 1988).

The term, "dynamic slit gates," is understood to refer to two plane-parallel plates which by their aperture effect as well as the intermediate pumping greatly reduce gas overflow in the vacuum. The aperture effect and hence the gas separation is further intensified by the fact that, in in-line apparatus, flat glass substrates are transported closely together so that the free gate slit is additionally narrowed.

This "gas separating principle," however, can be achieved economically only with flat substrates. For large-area curved substrates, such as automobile glass with various bends and radii of curvature, a so-called "buffer chamber" with two additional transfer chambers must be used between cathodes operating in parallel in different gas atmospheres. The buffer chamber creates a gas separation with two gate valves.

In multilayer systems this means that several gas separating chambers are necessary, and due to the resultant length the apparatus become uneconomical, or the consequence is poor flexibility of the apparatus for different coating systems.

For large, curved substrates the so-called "multipass" type of apparatus has established itself as an economical alternative.

The "multipass" apparatus have only one sputtering chamber with cathodes disposed directly side by side, and thus are substantially smaller than comparable in-line systems. In a "multipass" system the substrate to be coated is, by definition, passed repeatedly through the sputtering chamber.

Since the coating apparatus referred to above are usually operated continuously for the production of mass goods, such as automobile window glass, for example, and the manufacturing costs of these goods constitute an appreciable influencing factor, there has been a search for cost-saving measures and ways of increasing productivity. It is therefore the object of this invention to reduce the cycle time of the multipass process, i.e., to increase the throughput of substrates per unit time.

In a multiple coating process the time consumed by the coating steps is dependent on the length of the substrate, and so nothing can be saved in these steps. Another factor is the sputter starting time, i.e., before a sputtering or spraying process begins, the cathodes that are to be sputtered are primed until a stable sputtering process is established. The influence of the priming time on the overall cycle can be reduced, however, by "lengthening" the substrates, i.e., combining a number of substrates.

This is achieved in accordance with the invention by the fact that the substrates to be coated, or the carriers holding the substrates, are combined in groups, preferably of two or even more substrates or carriers each, and these are passed through the sputtering chamber simultaneously in the so-called "dual multipass" mode.

A coating process of the kind described above achieves decidedly shorter cycle times, and therefore a greater throughput. For example, a system for coating auto glass with a 4-shift system using the conventional multi-pass process can achieve a throughput of about 311,040 pieces per year, while a comparable system operated on the dual multipass process achieves a throughput of about 518,400 pieces per year. This corresponds to a throughput increase of at least better than 60%, for a reasonable cost for the expansion or modification of the entire apparatus. (The throughput figures are based on 6,000 hours of production per year at a machine availability of 90% and a yield of 96%.)

Additional embodiments and features are further described and characterized in the subordinate claims.

BRIEF DESCRIPTION OF THE DRAWINGS

The invention admits of various embodiments; one of them is represented in the appended drawings, wherein:

FIG. 1 is a schematic diagram of a multipass sputtering apparatus consisting essentially of a plurality of chambers in tandem, and FIG. 2 is a diagram of the performance of the dual multipass process.

As FIG. 1 shows, the substrates to be coated 1, 1', . . . are introduced horizontally in direction B into an entrance chamber 2 which can be closed by means of gate valves 3, 3'. Chamber 2 is adjoined by a buffer chamber 4 which in turn can be closed off from a transfer chamber 5 by a gate valve 3''. The transfer chamber 5 leads into a sputtering chamber 6 which is subdivided into a plurality of divisions 6', 6'', . . . of equal size. Each individual division 6', 6'', . . . is provided with a cathode 7, 7', . . . as well as a vacuum pump 8, 8', . . . The cathodes 7, 7', . . . and pumps 8, 8', . . . are disposed in a plane extending above the plane of movement B of the substrates 1, 1', . . . The sputtering chamber 6 is adjoined at the output end by the same chambers as were arranged at the input end, but in reverse order. These are a transfer chamber 9, a buffer chamber 10, and an exit chamber 11, these chambers being closable by gate valves 3, 3', . . . The substrates 1, 1', . . . can be moved freely on the one hand through the chambers 2, 4, 5, . . . , as described above, and on the other hand they can also run on carriers 12, 12', . . . through chambers 2, 4, 5, . . . , one carrier 12, 12', . . . , being able to hold a plurality of substrates 1, 1', . . .

In FIG. 2 there is shown, for one thing, the principle of construction of a multipass sputtering system of FIG. 1 which consists essentially of the chambers 2, 4, 5, 6, 9, 10 and 11. The lengths of the chambers are such that one substrate can be placed in each of the chambers 2, 4, 10 and 11, and two substrates 1, 1', . . . or carriers 12, 12', . . . in each of chambers 5, 6 and 9. Several cathodes 7, 7', ... are disposed in sputtering chamber 6 above the plane of movement B.

This above-described chamber arrangement is on the other hand shown repeatedly in FIG. 2, the time-frame of a dual multipass process being shown in individual steps. In the example represented, what is involved is the deposition of three coats on the substrates 1, 1', ...

The steps in the process are numbered at the left margin of FIG. 2, and defined as follows:

1. Represented in the uppermost row is the initial state before the coating process begins; one substrate 1, 1', ... is in each of the chambers 2, 4 and 5.

2. One substrate is moved in direction B from buffer chamber 4 to the transfer chamber 5.

3. One substrate 1" follows, from the entrance chamber 2 into the buffer chamber 4. In the transfer chamber 5 there are now two substrates 1 and 1' at the same time (dual). The dual multipass process is ready to begin.

4. Into the new empty entrance chamber 2 a substrate 1''' is loaded. A substrate 1" is in the buffer chamber 4. The dual multipass process begins; the two substrates 1 and 1' are transported into the sputtering chamber 6 and provided with the first of the coatings to be applied.

5. There is one substrate 1" and 1''' in each of the two chambers 2 and 4. The two substrates 1 and 1' provided with a first coat are now in the "waiting position" in the transfer chamber 9.

6. The two substrates 1", 1''' remain in chambers 2 and 4. Substrates 1, 1' are now moved at the same time (dual) and in direction E contrary to the previous direction of movement, through the sputtering chamber 6 to the transfer chamber 5, and a second coat is applied to the substrates 1 and 1' in the sputtering chamber 6.

7. The two substrates 1 and 1' are now moved again at the same time (dual) in direction B through the sputtering chamber 6, and a third coat is applied. The substrates 1" and 1''' are advanced each by one chamber at the same time as the already coated substrates 1 and 1', so that, after the end of step 7, the starting position is reached as described in step 1, and another dual multipass coating process can begin.

Instead of the substrates 1, 1', ... shown in FIG. 2, the process steps could also be described with carriers 12, 12'.

We claim:

1. Method for coating curved substrates by cathode sputtering in a vacuum apparatus having different chambers with at least one sputtering chamber, which is subdivided into several divisions which are provided each with a sputtering cathode, uncoated curved substrates being moved through the vacuum apparatus by means of a transport system including carriers, in a forward direction of movement, the method comprising: passing curved substrates in an in-line translation through the sputtering chamber repeatedly in a forward direction of movement as well as in an opposite direction in a multipass mode with the sputtering chamber empty of substrates between translations in the forward direction and in the opposite direction, passing the substrates through a lock individually into a transfer chamber disposed ahead of the sputtering chamber in the forced direction of movement and then combining sequentially the substrates to be coated prior to entrance into the spurring chamber in groups of several substrates, and running each group of substrates simultaneously through the sputtering chamber in an in-line translation.

* * * * *